(12) United States Patent
Sugimoto

(10) Patent No.: US 9,197,048 B2
(45) Date of Patent: Nov. 24, 2015

(54) HIGH-VOLTAGE ELECTRICAL JUNCTION BOX

(71) Applicants: FURUKAWA ELECTRIC CO., LTD., Tokyo (JP); FURUKAWA AUTOMOTIVE SYSTEMS INC., Shiga (JP)

(72) Inventor: Kaoru Sugimoto, Tokyo (JP)

(73) Assignees: FURUKAWA ELECTRIC CO., LTD., Tokyo (JP); FURUKAWA AUTOMOTIVE SYSTEMS INC., Shiga (JP)

(*) Notice: Subject to any disclaimer, the term of this patent is extended or adjusted under 35 U.S.C. 154(b) by 0 days.

(21) Appl. No.: 14/214,385

(22) Filed: Mar. 14, 2014

(65) Prior Publication Data

US 2014/0273554 A1    Sep. 18, 2014

Related U.S. Application Data

(63) Continuation of application No. PCT/JP2012/082623, filed on Dec. 17, 2012.

(30) Foreign Application Priority Data

Mar. 14, 2012 (JP) ................................. 2012-056761

(51) Int. Cl.
*H01R 12/58* (2011.01)
*H02G 3/08* (2006.01)
*B60R 16/023* (2006.01)
*H05K 7/02* (2006.01)
*H02G 3/16* (2006.01)

(52) U.S. Cl.
CPC .............. *H02G 3/08* (2013.01); *B60R 16/0238* (2013.01); *H05K 7/026* (2013.01); *H02G 3/16* (2013.01)

(58) Field of Classification Search
CPC .... H01R 2201/26; H01R 9/223; H01R 12/58; H01R 9/28
See application file for complete search history.

(56) References Cited

U.S. PATENT DOCUMENTS 6,494,723 B2 * 12/2002 Yamane et al. ............... 439/76.2
6,551,112 B1 * 4/2003 Li et al. ............................ 439/66

(Continued)

FOREIGN PATENT DOCUMENTS

| JP | H11-332058 | 11/1999 |
| JP | 2000-253514 | 9/2000 |

(Continued)

OTHER PUBLICATIONS

Japan Application No. 2012-056761; Office Action; dated May 26, 2014; 8 pages.

(Continued)

*Primary Examiner* — Truc Nguyen
(74) *Attorney, Agent, or Firm* — Baker & Hostetler LLP

(57) ABSTRACT

A high-voltage electrical junction box includes a box body having an insulating property, a board having an insulating property, the board being accommodated in the box body, a bus bar that is disposed on one surface of the board, a printed pattern that is formed on another surface of the board, a first through hole that is formed to penetrate through the bus bar, the board and the printed pattern, and a first connection piece that is inserted through the first through hole, the first connection piece being connected to the bus bar, the board and the printed pattern.

8 Claims, 9 Drawing Sheets

(56) References Cited

U.S. PATENT DOCUMENTS

| | | | |
|---|---|---|---|
| 7,381,065 B2 * | 6/2008 | Ikeda et al. | 439/76.2 |
| 8,708,715 B2 * | 4/2014 | Kobayashi et al. | 439/76.2 |
| 8,867,220 B2 * | 10/2014 | Kita | 361/752 |
| 2002/0003377 A1 | 1/2002 | Yuasa et al. | |
| 2002/0072257 A1 | 6/2002 | Kato et al. | |
| 2006/0292903 A1 | 12/2006 | Kanou | |
| 2007/0217168 A1 * | 9/2007 | Masuyama et al. | 361/748 |

FOREIGN PATENT DOCUMENTS

| | | |
|---|---|---|
| JP | 2001-286035 | 10/2001 |
| JP | 2002-112435 | 4/2002 |
| JP | 2002-186150 A | 6/2002 |
| JP | 2008-054449 | 3/2008 |
| JP | 2008-259286 | 10/2008 |
| JP | 2008-301677 | 12/2008 |
| JP | 2011-003618 | 1/2011 |

OTHER PUBLICATIONS

Japan Application No. 2012-056761; Office Action; dated Jan. 19, 2015; 6 pages.

International Patent application No. PCT/JP2012/082623: International Search Report and Written Opinion dated Jan. 29, 2013, 5 pages.

International Patent Application No. PCT/JP2012/082623; Written Opinion of the Int. Searching Authority; dated Jan. 29, 2013; 10 pages.

European Patent Application No. 12871517.4; Extended European Search Report; dated Mar. 26, 2015; 6 pages.

Japan Patent Application No. 2012-056761; Decision to Grant; Jul. 21, 2015; 5 pages.

* cited by examiner

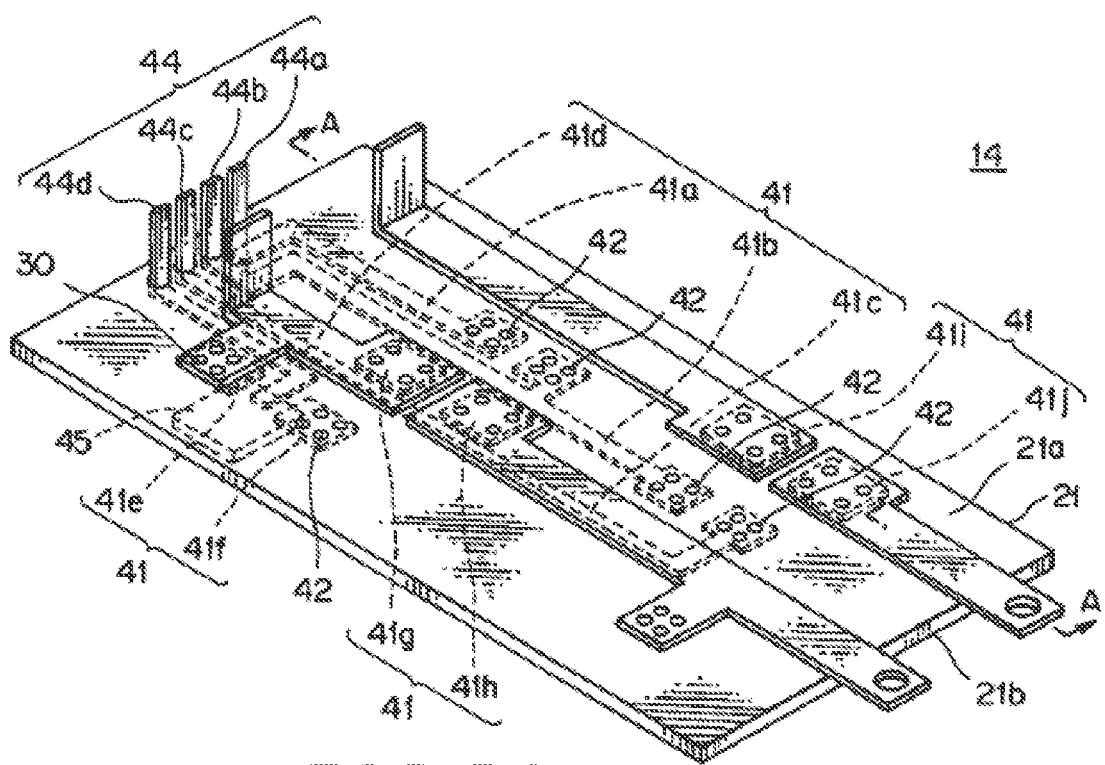
F I G. 5 A
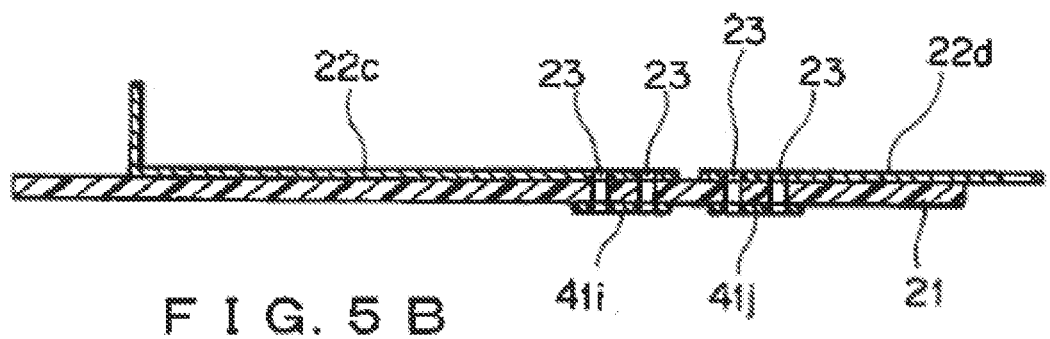
F I G. 5 B

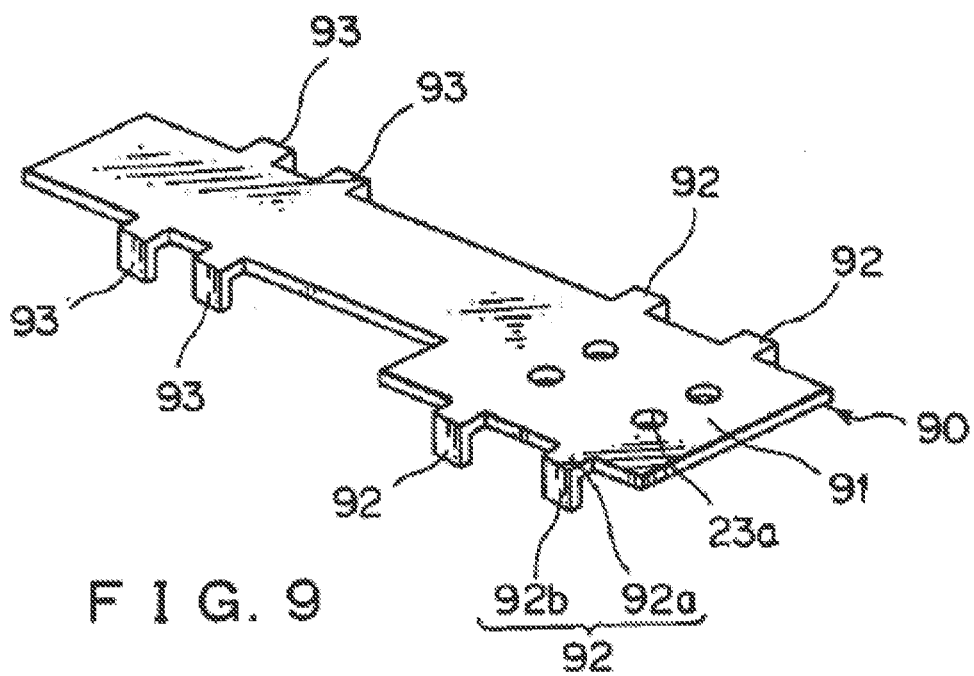
F I G. 9
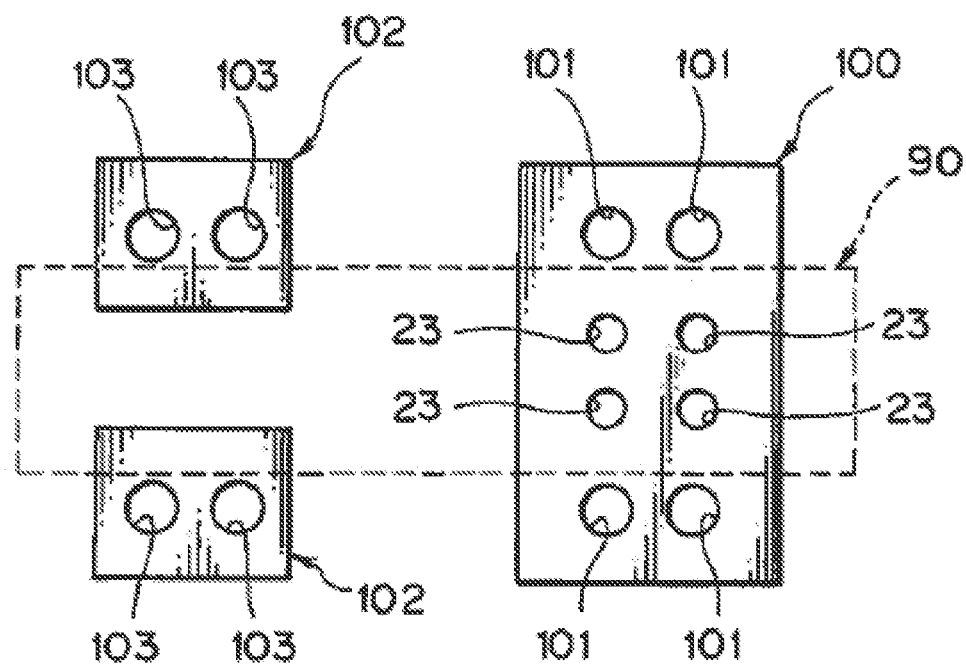
F I G. 10

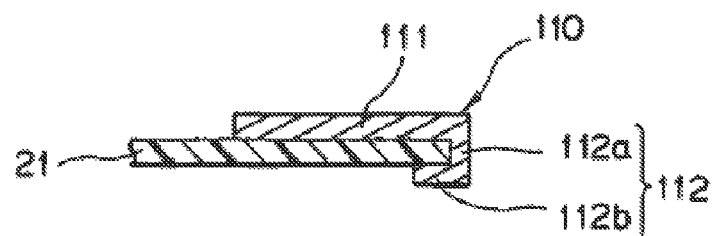
F I G. 11 A
F I G. 11 B
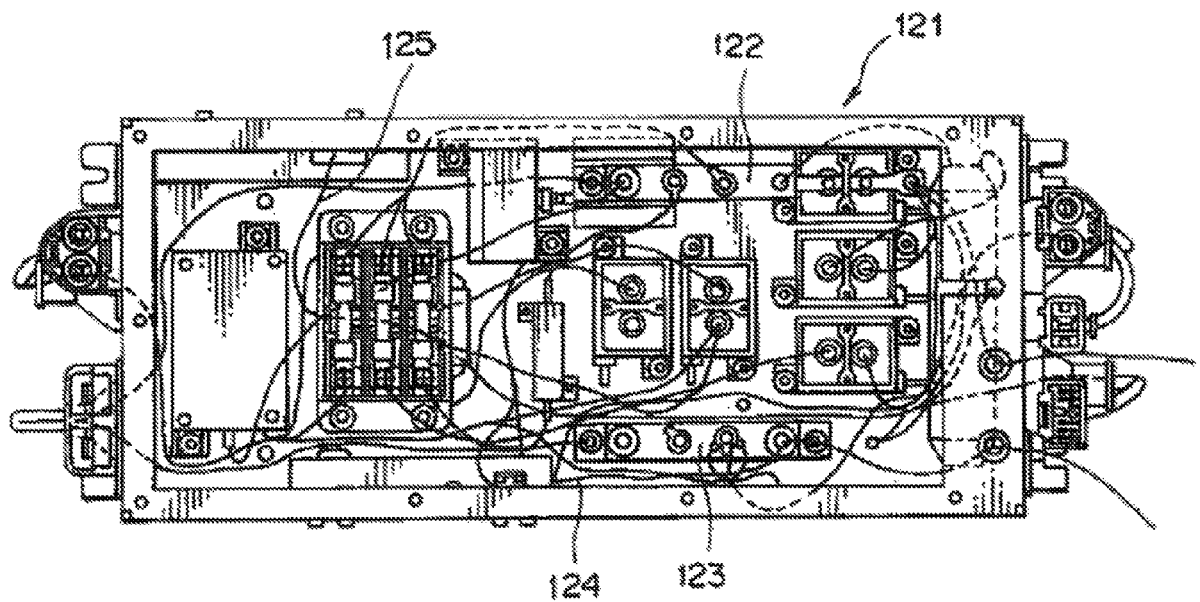
F I G. 12

HIGH-VOLTAGE ELECTRICAL JUNCTION BOX

CROSS REFERENCE TO RELATED APPLICATIONS

This is a continuation application of International Patent Application No. PCT/JP2012/082623 filed Dec. 17, 2012, which claims the benefit of Japanese Patent Application No. 2012-056761, filed Mar. 14, 2012, the full contents of all of which are hereby incorporated by reference in their entirety.

BACKGROUND

1. Technical Field

The present invention relates to a high voltage electrical junction box, and particularly relates to a high-voltage electrical junction box that is installed in a high-voltage vehicle to connect a power supply such as a battery to a drive source.

2. Background Art

In the related art, vehicles such as electric vehicles are equipped with a high-voltage electrical junction box called a junction block that is disposed between a power supply, such as a battery, and a drive source. By electrically connecting the battery and the drive source with each other via the electrical junction box, an electric power of the battery is supplied to the drive source.

FIG. 12 is a plan view showing an example of a configuration of an electrical junction box of the related art.

As illustrated in FIG. 12, a high-voltage system circuit (90V to 350V) and a low-voltage system circuit (generally 12V) are arranged inside a junction block 121 together with a plurality of electric components or the like. The high-voltage system circuit is routed with bus bars 122, 123 and a group of wires 124, and the low-voltage system circuit is routed with a wire harness 125 constituted by a plurality of electric wires. In this manner, by using the bus bars 122, 123, the group of wires 124 and the wire harness 125 differently depending on their use, a high-density internal circuit routing of the junction block 121 can be achieved (see Japanese Laid-Open Patent Publication No. 2000-253514).

However, the aforementioned electrical junction box of the related art has the following problems. In a case where a circuit whereto a high voltage of around 200V is applied and a circuit whereto a low voltage which is a rated voltage 12V is applied (in a signal system of an electric equipment component, a coil in a relay, etc.) are provided inside the electrical junction box, a leakage current due to a potential difference is likely to occur. Also, a leakage current is also likely to occur in a circuit whereto a high voltage is applied.

Recently, due to an increase in various electric components incorporated in an electrical junction box, a routing using bus bars and electric wires requires an increased number of bus bars and electric wires corresponding to the number of various electric components, and thus an assembly work becomes more cumbersome and the cost may increase. Further, because of a continuous arrangement of various electrical components, bus bars and electric wires on a single plane, the electrical junction box becomes bulky and an in-vehicle space cannot be used effectively.

Further, with the configuration of the electrical junction box described above, when various electrical components are circuit connected to the bus bars and the electric wires, it is necessary to fasten each other with numerous bolts (screws). However, the bolt (screw) fastening has a problem that a fastening function itself can be lost due to "the loosening of the screw," and there is a problem that it may lead to a decrease in reliability/safety of the circuit connection.

SUMMARY

It is an object of the present disclosure to provide a high-voltage electrical junction box that prevents generation of a leakage current and improves reliability of a circuit connection, reduces cost by achieving an easy assembly work, and further make an effective use of an in-vehicle space by achieving miniaturization.

In order to achieve the above mentioned object, the high-voltage electrical junction box of the present disclosure includes a box body having an insulating property, a board having an insulating property, the board being accommodated in the box body, a bus bar that is disposed on one surface of the board, a printed pattern that is formed on another surface of the board, a first through hole that is formed to penetrate through the bus bar, the board and the printed pattern, and a first connection piece that is inserted through the first through hole, the first connection piece being connected to the bus bar, the board and the printed pattern.

It is preferable that the first connection piece has a recessed portion whereto a relay terminal is connected, the recessed portion being provided at an upper portion of the first connection piece.

Further, it is preferable that the first connection piece is press-fit into the first through hole.

Further, it is preferable that the high-voltage electrical junction box further includes a second through hole that is formed to penetrate through the board and the printed pattern, and a second connection piece that is inserted through the second through hole, the second connection piece being electrically connected to the printed pattern.

It is preferable that the second connection piece has a recessed portion whereto a relay terminal is connected, the recessed portion being provided at an upper portion of the second connection piece.

Further, it is preferable that a plurality of the bus bars are disposed on the board and the high-voltage electrical junction box includes an opening portion formed between the bus bars adjacent to each other on the board, and a protruding portion that extends inwardly from an inner surface of the box body, the protruding portion being inserted into the opening portion.

Further, it is preferable that the bus bar has at least one extending portion that extends in a direction towards the board and the high-voltage electrical junction box further includes a third through hole that is formed to penetrate through the board and the printed pattern, the least one extending portion being press-fit into the third through hole.

Further, it is preferable that a semiconductor relay for precharging the relay is mounted on the other surface of the board.

According to the present disclosure, a bus bar of a high-voltage system is disposed on one surface of a board accommodated in an insulating box body and a printed pattern of a low-voltage system is disposed on the other surface of the board. The bus bar, the board and the print pattern are connected collectively by inserting a first connection piece into a first through hole that is formed to penetrate through the bus bar, the board and the printed pattern.

That is to say, an occurrence of the leakage current can be prevented by disposing, on either side of and across an insulating board, circuits of a high-voltage system and a low-voltage system in which a leakage current is likely to occur. Also, by providing the bus bar, the board and the printed pattern as an integral structure which are connected by the first connection piece, the number of components can be reduced and the cost can be reduced by achieving an easy assembly. Also, since the bus bar and the printed pattern are placed on either side of a single-layered board, the electrical junction box can be miniaturized and the in-vehicle space can be used effectively.

Further, by press-fitting a connection piece into a through hole formed through a bus bar, a board and a printed pattern, since electrical connection is obtained simultaneously with mechanical connection, a problem of looseness due to fastening of the bolt (screw) does not occur and reliability/safety of the circuit connection can be improved.

BRIEF DESCRIPTION OF DRAWINGS

FIGS. 5A and 5B are diagrams showing a configuration of a lower surface side of the circuit structure of FIG. 2, in which FIG. 5A is a perspective view showing a configuration of a lower surface side of the circuit structure of FIG. 2 and FIG. 5B is an A-A cross sectional view showing a configuration of a lower surface side of the circuit structure of FIG. 2.

FIG. 9 is a perspective view showing a variant of a bus bar mounted on a circuit structure of FIG. 6.

FIG. 10 is a plan view in which a mounting location of the bus bar of FIG. 9 is viewed from a lower surface side of the circuit structure.

FIG. 11A and FIG. 11B are cross sectional views showing a variant of the bus bar of FIG. 9.

FIG. 12 is a plan view showing an example of the configuration of the electrical junction box of the related art.

DETAILED DESCRIPTION

Further features of the present disclosure will become apparent from the following detailed description of exemplary embodiments with reference to the accompanying drawings.

Figure 1:
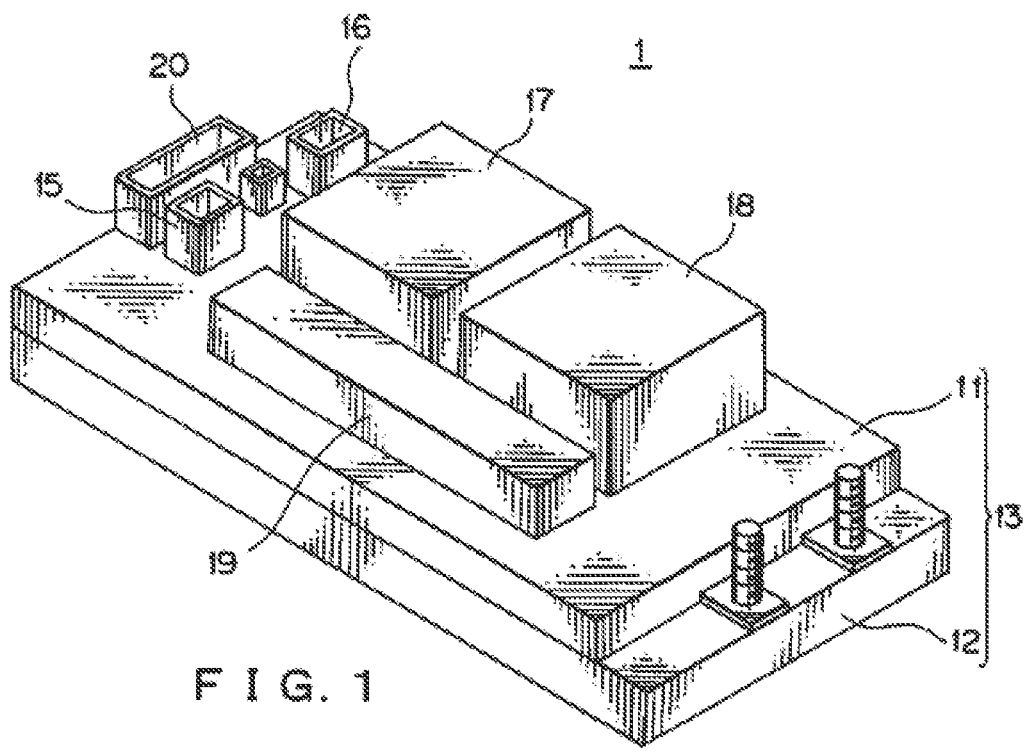
FIG. 1 is a perspective view schematically showing a configuration of a high-voltage electrical junction box of an embodiment of the present disclosure.
Figure 2:
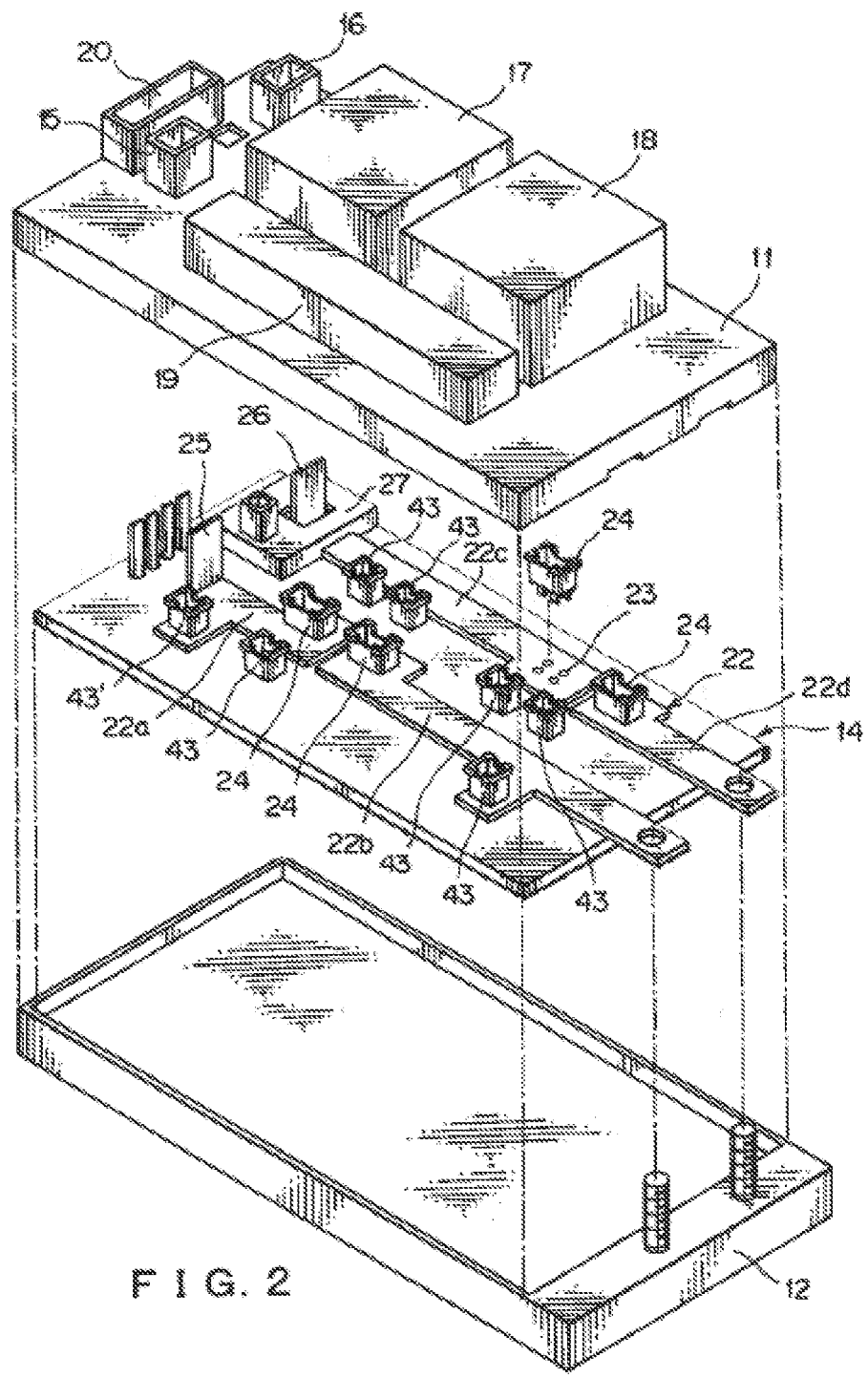
FIG. 2 is an exploded perspective view showing an internal structure of the high-voltage electrical junction box of FIG. 1.

FIG. 1 is a perspective view schematically showing a configuration of a high-voltage electrical junction box of an embodiment, and FIG. 2 is an exploded perspective view.

A high-voltage vehicle such as a hybrid vehicle or an electric vehicle is equipped with a high-voltage electrical junction box 1 provided with an insulating box body 13 having an upper casing 11 and a lower casing 12, and a circuit structure 14 accommodated in the box body 13, as shown in FIGS. 1 and 2. The high-voltage electrical junction box 1 is referred to as a junction block that electrically connects/cuts off a storage battery module and a driving motor, not shown, and configured to supply an electric power of the storage battery module to the driving motor via a motor control unit, not shown.

Mounted on an upper surface of the upper casing 11 are a connector 15 (+) and a connector 16 (−) of a high-voltage system connected to a storage battery module, a system main relay 17 (+) and a system main relay 18 (−) connected to the two connectors respectively via bus bars described below, a resistor 19 connected to a semiconductor relay described below, and a connector 20 of a low-voltage system.

Figure 3:
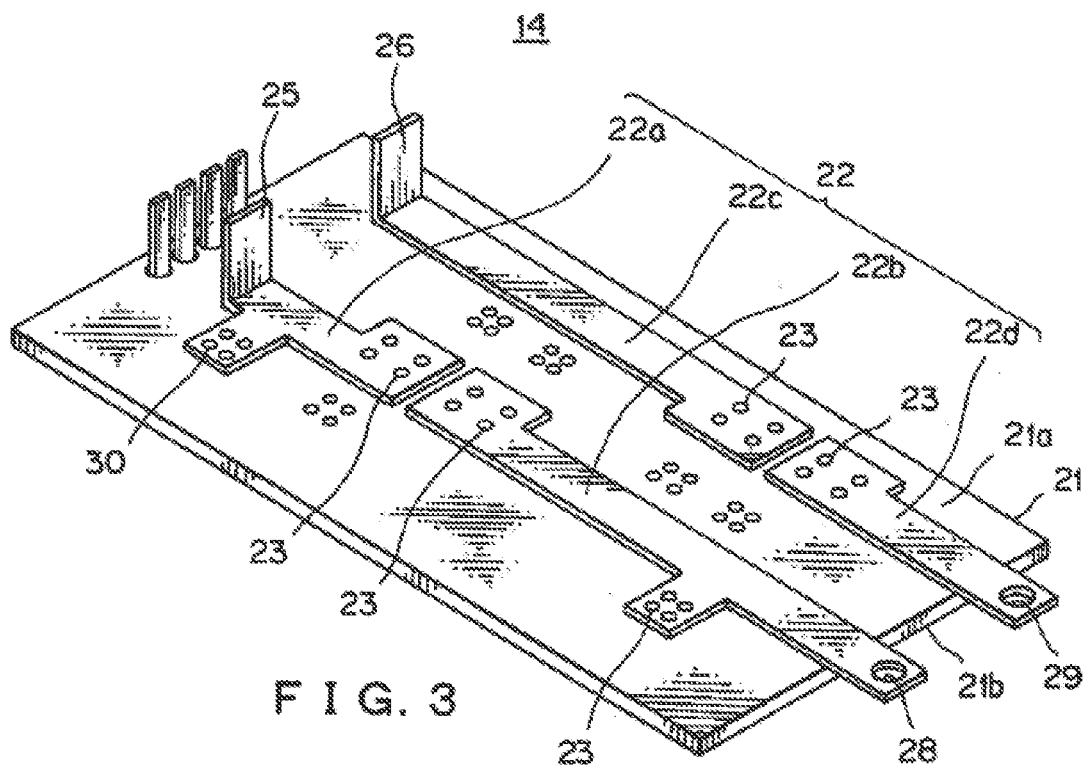
FIG. 3 is a perspective view showing a configuration of an upper surface side of the circuit structure of FIG. 2.
Figure 4:
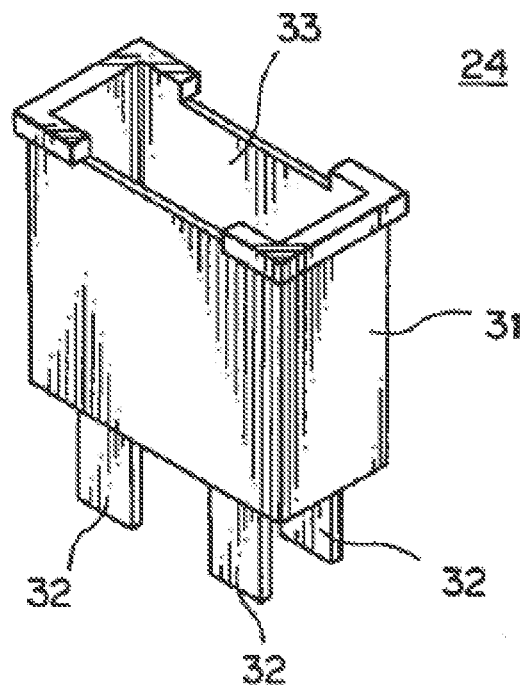
FIG. 4 is a perspective view showing a configuration of the connection piece of FIG. 2.

FIG. 3 is a perspective view showing a configuration of an upper surface side of the circuit structure 14 of FIG. 2, and FIG. 4 is a perspective view showing a configuration of a connection piece of FIG. 2. FIGS. 5A and 5B are diagrams showing a configuration of a lower surface side of the circuit structure 14 of FIG. 2, in which FIG. 5A is a perspective view and FIG. 5B is an A-A cross sectional view.

As shown in FIGS. 3 to 5B, the circuit structure 14 has a group of bus bars 22 of a high-voltage system disposed on an upper surface 21a of a board 21, through holes 23 (first through hole) that are formed to penetrate through each bus bar, the board 21 and printed patterns to be described below, and a connection piece 24 (first connection piece) that is inserted into the through holes and connected to each bus bar, the board 21 and each printed pattern. The through holes 23 are, for example, constituted by four through bores whereto four ribs provided on the connection piece 24 described later are press-fit.

The board 21 is made of an insulating material, and, for example, made of an epoxy-based resin containing glass fibers. The group of bus bars 22 includes bus bars 22a, 22b connected to the system main relay 17 and bus bars 22c, 22d connected to the system main relay 18.

At one end of the bus bar 22a, an extending portion 25 is provided that extends substantially perpendicularly to the board 21 and connected to the connector 15. At the other end of the bus bar 22a, the through holes 23 are formed. The bus bar 22b is provided with the through holes 23 formed at one end thereof and a hole 28 formed at the other end thereof through which a bolt attached to the lower casing 12 is inserted.

At one end of the bus bar 22c, an extending portion 26 is provided that extends substantially perpendicularly to the board 21 and connected to the connector 16. At the other end of the bus bar 22c, the through holes 23 are formed. A current sensor 27 is disposed around the extending portion 26 (FIG. 2) and detects a current flowing through the extended portion based on a magnetic field produced around the extending portion 26. The bus bar 22d is provided with the through holes 23 formed at one end thereof, and a hole 29 formed at the other end thereof through which a bolt attached to the lower casing 12 is passed.

The connection piece 24 has a housing 31 having a substantially rectangular tubular shape, four ribs 32 that extend downwardly from a bottom portion of the housing, and a recessed portion 33 formed at an upper part of the housing 31 and into which a relay terminal to be described later is inserted (FIG. 4). The bus bars 22a, 22c and the system main relay 17 are connected via the connection piece 24 and the bus bars 22b, 22d and the system main relay 18 are connected via the connection piece 24. By press-fitting the ribs 32 of the connection piece 24 into the through holes 23 from an upper surface side of the board 21 with a lower surface of each bus bar abutting the upper surface 21a of the board 21, each bus bar is fixed to the board 21 and also each bus bar and the connection piece 24 are electrically connected (FIG. 2, FIG. 3). Also, since a contact area between the ribs and each bus bar increases due to the press fitting of the ribs 32 into the through holes 23, reliability of electrical connection can be improved.

Also, the circuit structure 14 has a group of printed patterns 41 of a low-voltage system formed on a lower surface 21b of the board 21, through holes 42 (second through hole) formed to penetrate through the board 21 and each printed pattern, and a connection piece 43 (second connection piece) that is inserted into the through holes 42 and electrically connected to each printed pattern. Since the structure of the connection piece 43 is basically the same as that of the connection piece 24, an explanation thereof is omitted.

The group of printed patterns 41 is constituted by strip-shaped printed patterns 41a to 41d and substantially sheet-shaped printed patterns 41e to 41j.

One ends of the printed patterns 41a to 41d are connected to the respective terminals 44a to 44d of the group of terminals 44. Through holes 42 are formed at respective another ends of the printed patterns 41a to 41c, and, the printed pattern 41b is provided with other through holes 42 formed substantially in the middle thereof. The other end of the printed pattern 41d is connected to a semiconductor relay which will be described later.

The printed patterns 41a, 41b and the system main relay 17 are connected via the connection piece 43, and the printed patterns 41b, 41c and the system main relay 18 are connected via the connection piece 43. Each printed pattern and the connection piece 43 are electrically connected by press-fitting the rib 32 of the connection piece 43 into the through hole 42 from the upper surface side of the board 21. Also, by press-fitting the rib 32 into the through hole 42, a contact area between the rib and each printed pattern increases, and reliability of the electrical connection can be improved.

On the lower surface 21b of the board 21, a semiconductor relay 45 for precharging the system main relays 17, 18 is mounted (FIG. 5A). By mounting the semiconductor relay 45 on the lower surface 21b, miniaturization of the high-voltage electrical junction box 1 can be achieved as compared to a case where the semiconductor relay 45 is mounted on the upper surface 21a. The semiconductor relay 45 is connected in parallel with the system main relay 18 via the resistor 19, and by performing an ON-operation of the semiconductor relay 45 before performing on ON-operation of the system main relay 17, an inrush current is suppressed.

In the vicinity of the semiconductor relay 45, substantially rectangular printed patterns 41e and 41f are formed. The printed pattern 41e has through holes 30 formed therethrough, and the printed pattern 41f has through holes 42 formed therethrough. The through holes 30 are formed to penetrate through the bus bar 22a, the board 21 and the printed pattern 41e, and the bus bar 22a and the printed pattern 41e are electrically connect via a connection piece 43'.

The substantially rectangular printed patterns 41g to 41j have through holes 23 formed therethrough (FIG. 5B). By press-fitting the connection piece 24 of FIG. 4 into the through holes 23, the bus bar 22a, the board 21 and the printed pattern 41g are connected collectively. In this manner, by joining the bus bar of the high-voltage system and the printed pattern of the low-voltage system with the board 21, a contact area between the connection piece 24 and two types of conductors increases and reliability of circuit connection can be improved. Similarly, the bus bars 22b to 22d are connected collectively to the printed patterns 41h to 41j, respectively, with the board 21.

Note that, since a high voltage is applied to the printed patterns 41g to 41j, it is preferable that the printed patterns 41g to 41j are disposed at a predetermined distance from the printed patterns 41a to 41d whereto a low voltage is applied. Thereby, a creeping distance between the printed patterns is ensured and an occurrence of a leakage current can be prevented.

The connection pieces 24 and 43 are connected to each bus bar and/or each printed pattern by press-fitting, and may be further connected by soldering. Thereby, reliability of the circuit connection can be further improved.

Figure 6:
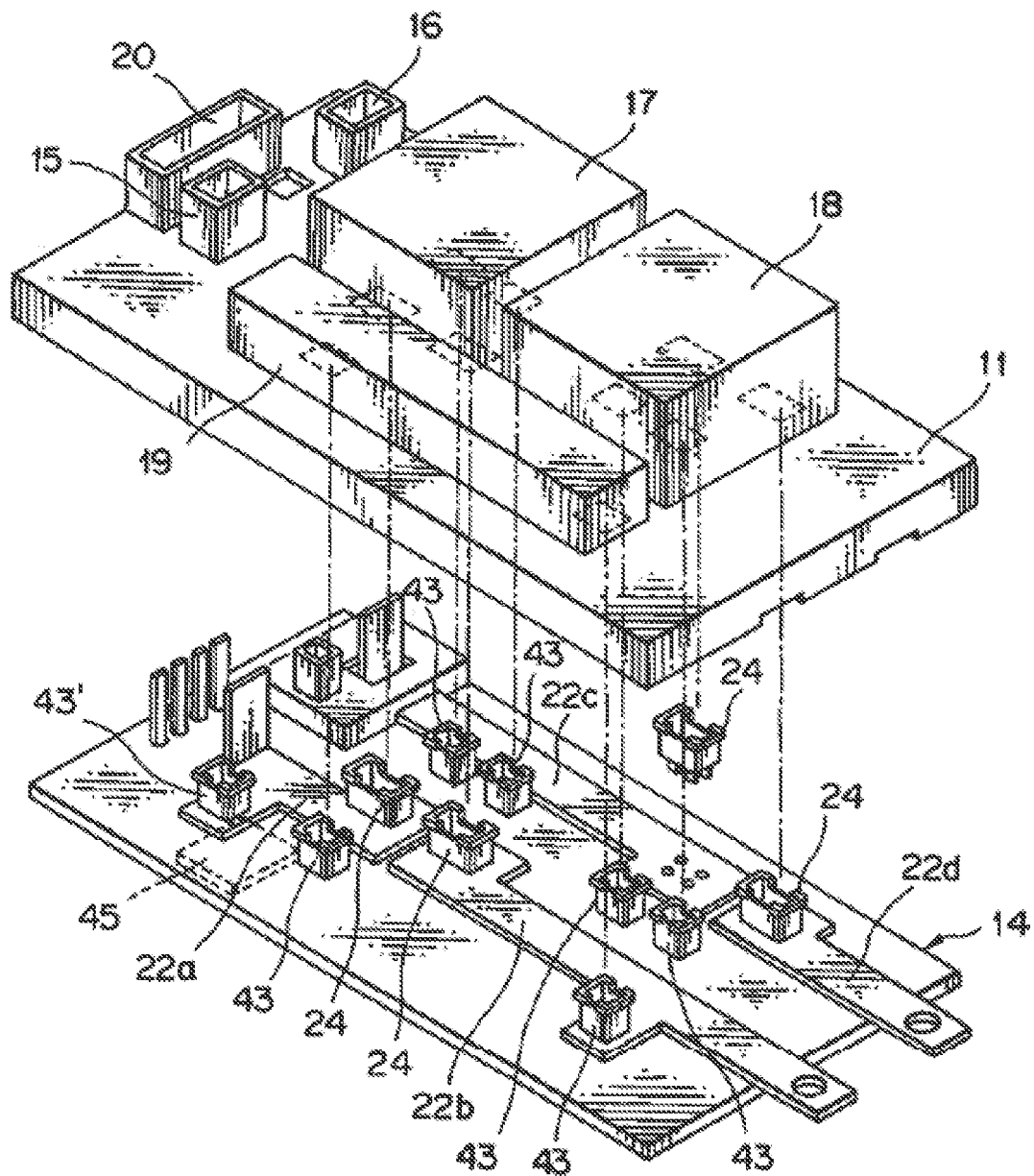
FIG. 6 is a perspective view for explaining a connection between an upper casing and a circuit structure of FIG. 1.
Figure 7A:
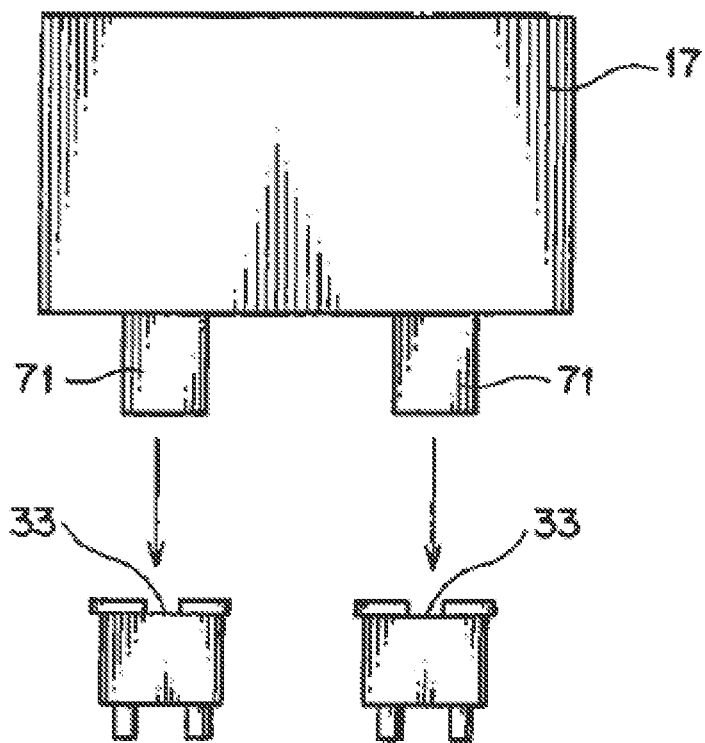
FIG. 7A is an elevational view explaining a connection between a system main relay and a connection piece of FIG. 6.
Figure 7B:
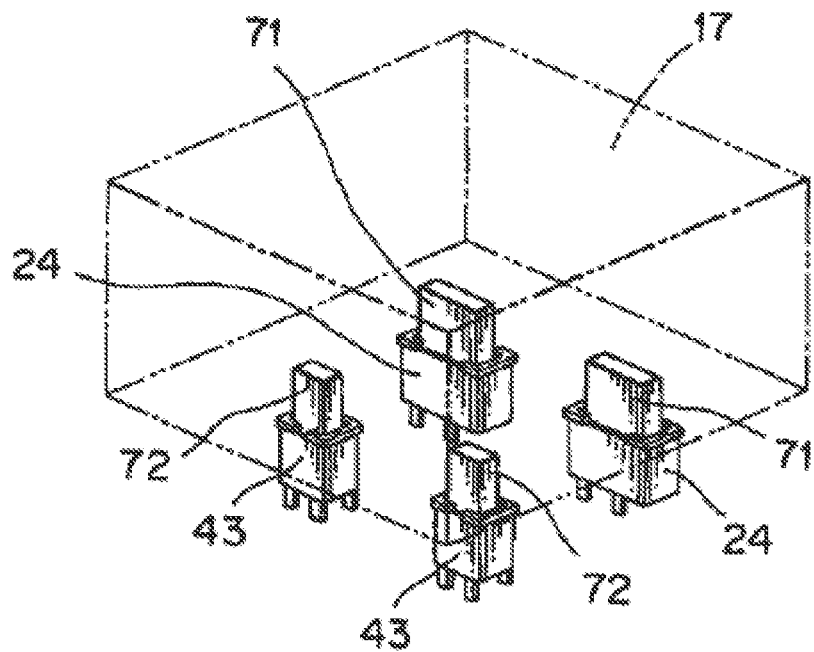
FIG. 7B is a perspective view explaining a connection between a system main relay and a connection piece of FIG. 6.

FIG. 6 is a perspective view for explaining a connection between the upper casing of FIG. 1 and the circuit structure. FIGS. 7A and 7B are diagrams for explaining a connection between the system main relay and the connection piece of FIG. 6, in which FIG. 7A is a plan view and FIG. 7B is a perspective view.

As shown in FIG. 6, by mounting the system main relay 17 on the upper casing 11, a main circuit of the system main relay 17 is connected to the bus bars 22a and 22b via the connection piece 24 and a control circuit of the system main relay 17 is connected to the printed patterns 41a, 41b via the connection piece 43. Also, by mounting the system main relay 18 on the upper casing 11, a main circuit of the system main relay 18 is connected to the bus bars 22c and 22d via the connection piece 24 and a control circuit of the system main relay 18 is connected to the printed patterns 41b and 41c via the connection piece 43.

The system main relay 17 has relay terminals 71 and 72 that extend downwardly from a lower surface thereof (FIGS. 7A and 7B). With the relay terminal 71 being fitted in the recessed portion 33 of the connection piece 24, an electrical connection between the relay and the connection piece 24 is obtained, and with the relay terminal 72 being fitted in a recessed portion of the connection piece 43, an electrical connection between the relay and the connection piece 43 is obtained. Since the system main relay 18 has basically the same configuration as the system main relay 17, an explanation thereof is omitted.

With the circuit structure 14 configured as described above, when a current flows through the control circuit of the system main relay 17 (+) via the printed patterns 41a and 41b, the system main relay 17 is turned on and the main circuit of the relay and the bus bars 22a and 22b are electrically connected. Also, when an electric current flows through the control circuit of system main relay 18 (−) via the printed patterns 41b and 41c, the system main relay 18 is turned on and the main circuit of the relay and the bus bars 22c and 22d are electrically connected. With the operation described above, the voltage of the storage battery module is supplied to the motor for driving.

As has been described above, according to the present embodiment, since the group of bus bars 22 of the high-voltage system and the group of printed patterns 41 of a low-voltage system, which are likely to produce a leakage current, are disposed on either side of and across the insulating board 21, an occurrence of a leakage current between the bus bars and the printed patterns can be prevented. Further, since each bus bar, the board and the printed pattern are provided as an integral structure connected with the connection pieces 24, reliability of the circuit connection can be improved and cost can be reduced by realizing an easy assembly. Further, since the group of bus bars 22 and the group of printed patterns 41 are arranged on either surface of a single-layered board, the high-voltage electrical junction box 1 can be miniaturized and a space inside the vehicle can be used effectively.

Note that, in the aforementioned embodiment, an occurrence of a leakage current between the group of bus bars 22 of the high-voltage system and the group of printed patterns 41 of the low-voltage system is prevented. However, it is possible to provide a configuration as described below to prevent an occurrence of a leak voltage between the groups of bus bars.

Figure 8A:
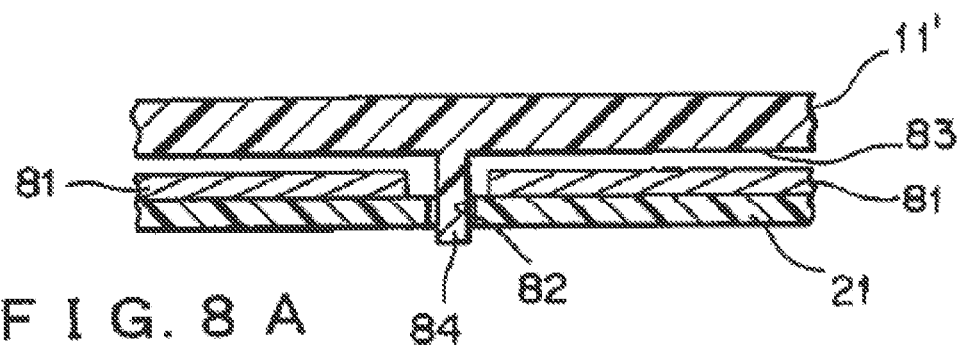
FIG. 8A is a cross sectional view showing a variant of a configuration of the upper casing and the circuit structure of FIG. 1.
Figure 8B:
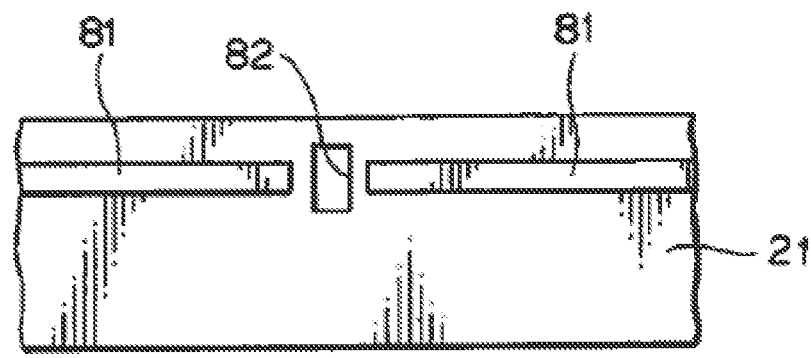
FIG. 8B is a plan view showing a variant of a configuration of the upper casing and the circuit structure of FIG. 1.

As shown in FIGS. 8A and 8B, the high-voltage electrical junction box has an opening portion 82 formed between bus bars 81, 81 that are adjacent to each other on the board 21, and a protruding portion 84 that extends inwardly from an inner surface 83 of an upper casing 11' and inserted into the opening portion 82. The protruding portion 84 is made of an insulating material and preferably formed integrally with the upper casing 11'. In FIG. 8A, the protruding portion 84 is provided to protrude from the upper casing 11', but may be provided to protrude from the lower casing.

In this manner, according to the present configuration, since the protruding portion 84 having an insulating property is inserted between the bus bars 81, 81 of the high-voltage system that are adjacent to each other, a leakage current path in the high-voltage system can be cut off and a creeping distance between the bus bars adjacent to each other can be increased. Also, since the protruding portion 84 is inserted into the opening portion 82, by forming the opening portion and the protruding portion with an appropriate size, the positioning or the securing of the opening portion 82 and the upper casing 11' can be realized in a facilitated manner.

Also, in the aforementioned embodiment, each bus bar is secured to the board 21 with the ribs 32 being press-fit into the through holes 23 (FIG. 3). However, as shown in FIG. 9, a bus bar 90 may be provided with bent portions 92 that extend in a direction towards the board. Specifically, the bent portion 92 has an extension base portion 92a that extends laterally from a side end surface of a bus bar main body 91 at one end portion in a longitudinal direction of the bus bar main body 91, and an extension end portion 92b that extends substantially perpendicularly from an end portion of the extension base portion.

The bent portion 92 is provided in the vicinity of a bore 23a forming a part of the through hole 23, and two bent portions 92 are arranged at one end in a lateral direction of the bus bar 90 and two bent portions 92 are arranged at the other end of the bus bar 90. With these bent portions 92 being press-fit into corresponding through holes 101 (FIG. 10), the bus bar 90, the board 21 and the printed pattern 100 are connected collectively. Thereby, the bus bar 90 can be positively secured to the board 21 and reliability of the connection can be further improved.

Also, the bus bar 90 has other four bent portions 93 provided at the other end portion in the longitudinal direction of the bus bar main body 91. By press-fitting the bent portions 93 into the corresponding through holes 103, the bus bar 90, the board 21 and the printed pattern 102 are connected collectively. Thereby, reliability of the connection can be further improved.

The bent portions 92 and 93 may be connected to the printed patterns 100 and 102 by press-fitting, and further, connection by soldering may be performed. Thereby, reliability of the circuit connection can be further improved.

Also, in the aforementioned embodiment, the bus bar 90 has the bent portions 92 and 93. However, the structure of the bus bar is not limited thereto.

For example, as shown in FIG. 11A, a bus bar 110 may have a folded-over portion 112 having an extension base portion 112a that extends substantially perpendicularly from a bus bar main body 111 and along a board end surface, and an extension end portion 112b that extends from the extension base portion and folded back substantially parallel to the bus bar main body 111. That is, according to the present configuration, by forming an end portion of the bus bar 110 into a U-shape and fitting the end surface of the board 21 into the end portion, the bus bar 110 can be positively secured to the board 21. Further, as shown in FIG. 11B, holes may be provided at an end portion of a bus bar 114 and at an end portion of the board 21, and a rivet piece 115 may be press-fit into both holes. According to such a configuration, the bus bar 114 can be positively secured to the board 21 and this may lead to a further improvement in the reliability of the connection.

In the foregoing, a high-voltage electrical junction box of the present embodiment has been described. However, the present disclosure is not limited to an embodiment of the description, and various modifications and alternations are possible based on a technical concept of the present invention.

What is claimed is:

1. A high-voltage electrical junction box comprising:
   a box body having an insulating property;
   a board having an insulating property, the board being accommodated in the box body;
   a bus bar that is disposed on one surface of the board;
   a first printed pattern and a second printed pattern that is disposed at a predetermined distance from the first printed pattern, the first printed pattern and the second printed pattern being formed on another surface of the board;
   a first through hole that is formed to penetrate through the bus bar, the board and the first printed pattern; and
   a first connection piece that is inserted through the first through hole, the first connection piece being connected to the bus bar, the board and the first printed pattern,
   wherein the bus bar that is a high-voltage system circuit and the second printed pattern that is a low-voltage system circuit is arranged across the board having the insulating property, and an occurrence of a leakage current between the bus bar and the second printed pattern is prevented.

2. The high-voltage electrical junction box according to claim 1, wherein the first connection piece has a recessed portion whereto a terminal of a system main relay is connected, the recessed portion being provided at an upper portion of the first connection piece.

3. The high-voltage electrical junction box according to claim 1, wherein the first connection piece is press-fit into the first through hole.

4. The high-voltage electrical junction box according to claim 1, further comprising:
   a second through hole that is formed to penetrate through the board and the second printed pattern; and
   a second connection piece that is inserted through the second through hole, the second connection piece being electrically connected to the second printed pattern.

5. The high-voltage electrical junction box according to claim 4, wherein the second connection piece has a recessed portion whereto a terminal of a system main relay is connected, the recessed portion being provided at an upper portion of the second connection piece.

6. The high-voltage electrical junction box according to claim 1, wherein a plurality of the bus bars is disposed on the board,
   the high-voltage electrical junction box further comprising:
   an opening portion provided to penetrate through the board and formed between the bus bars adjacent to each other on the board; and a protruding portion that extends inwardly from an inner surface of the box body, the protruding portion being inserted into the opening portion, a first bus bar of the plurality of the bus bars and a second bus bar of the plurality of the bus bars is provided at either side of the protruding portion, the first bus bar and the second bus bar being high-voltage system circuits, and an occurrence of a leakage current is prevented between the first bus bar and the second bus bar.

7. The high-voltage electrical junction box according to claim 1, wherein the bus bar has at least one bent portion that extends in a direction towards the board, the high-voltage electrical junction box further comprising a third through hole that is formed to penetrate through the board and the first printed pattern, the least one bent portion being press-fit into the third through hole.

8. The high-voltage electrical junction box according to claim 1, wherein a semiconductor relay for precharging the system main relay being mounted on the other surface of the board.

* * * * *